United States Patent [19]
Kozel

[11] Patent Number: 5,637,008
[45] Date of Patent: Jun. 10, 1997

[54] ZERO INSERTION FORCE MINIATURE GRID ARRAY SOCKET

[75] Inventor: Charles A. Kozel, McHenry, Ill.

[73] Assignee: Methode Electronics, Inc., Chicago, Ill.

[21] Appl. No.: 382,519

[22] Filed: Feb. 1, 1995

[51] Int. Cl.$^6$ .................................................. H01R 4/50
[52] U.S. Cl. ........................................ 439/342; 439/259
[58] Field of Search ......................... 439/342, 259–270, 439/68, 70

[56] References Cited

U.S. PATENT DOCUMENTS

| | | | |
|---|---|---|---|
| 4,531,792 | 7/1985 | Oshitani et al. | 439/264 |
| 4,744,768 | 5/1988 | Rios | 439/264 |
| 5,092,789 | 3/1992 | Sinclair | 439/342 |
| 5,419,710 | 5/1995 | Pfaff | 439/266 |
| 5,489,217 | 2/1996 | Scheitz et al. | 439/342 |

OTHER PUBLICATIONS

Drawing entitled 255 CBGA, 21 MM from Motorola Inc., "Mechanical Outlines Dictionary", JEDEC MO–156, JVAR ABG, Nov. 30, 1993, sheets 1 and 2.

*Primary Examiner*—Hien Vu
*Attorney, Agent, or Firm*—David L. Newman

[57] ABSTRACT

A zero insertion force ball grid array socket comprises a base having an array of passages and contacts mounted therein. A carrier for receiving the ball grid array package and slidingly movable from a nonmated position to a mated position. The contacts having surface mount tails exposed in a perpendicular direction above the base and the balls of the ball grid array package being inspectable from the opposite side of the carrier receiving the ball grid array package thereon.

18 Claims, 3 Drawing Sheets

ZERO INSERTION FORCE MINIATURE GRID ARRAY SOCKET

BACKGROUND OF THE INVENTION

This invention pertains to an electrical connector and, in particular, a zero insertion force miniature grid array socket for integrated circuit packages such as ball grid arrays or pin grid arrays.

Integrated circuits (I.C.s) have become the world's standard for electronic circuits. These range from basic transistor networks to complex memory, microprocessor and multichip module circuits. The common denominator to all such circuits is that they are produced en mass on a substrate such as silicon and then separated into individual units commonly known as chips. The majority of chips are then mounted in a carrier for subsequent incorporation into end products. The basic size, shape and construction of the carrier is commonly known as the package and many standard packages have emerged. Some examples are commonly known as D.I.P.S.O.J., P.L.C.C., Q.F.P. and B.G.A. Chip packages have developed to accommodate both circuit function, i.e., number and placement of the leads, and assembly trends, i.e., thru-board and surface mount solder assembly. While the majority of I.C. devices are hard soldered in place, several factors such as device availability, testing, upgrades, etc., have traditionally shown that there is need to socket I.C.s, regardless of their package. In fact, I.C. sockets are known in the art for receiving pin grid array packages (PGA) on 0.100 inch×0.100 inch spacing. However, there are many miniature I.C. packages which have spacing less than 0.100 inch×0.100 inch. As I.C. packages become more miniaturized, it is desirable to socket these packages. It is the intent of this invention to provide a simple, economical, reliable and space-efficient socketing system, targeted for today's high pin count, miniature I.C. packages such as miniature grid array packages which include ball grid arrays (BGA) packages and pin grid array packages.

Accordingly, it is an object of the present invention to provide a socket which may intermate with various miniature I.C. packages.

It is another object of the present invention to provide a socket which intermates with a miniature grid array package.

It is a further object of the present invention to provide a socket having a footprint identical to the I.C. package mounted thereto.

It is a further object of the present invention to provide a surface mount socket.

It is also an object of the present invention to provide a socket which has no real estate penalty on a printed circuit board.

It is another object of the present invention to provide a socket having a zero insertion force.

It is another object of the present invention to provide a socketing system in which the I.C. package is not subject to reflow soldering.

It is a further object of the present invention to provide a socket which allows for inspectability and repairability of contact solder joints.

It is also an object of the present invention to provide a socket having a low profile.

It is a further object of the present invention to provide a socket which provides for metal-to-metal connections.

It is another object of the present invention to provide a socket having low self inductance.

SUMMARY OF THE INVENTION

According to the above objects of the present invention, a miniature grid array socket is provided comprising a base having an array of passages, contacts mounted in the passages, a carrier mounted to the base, an a miniature grid array package mounted to the carrier and the miniature grid array package slidingly mating with the contacts. The carrier is mounted to the base with a zero insertion force. The carrier member includes slots which allow for the inspection of the mated miniature grid array package mounted thereto. The array of contacts provide a footprint of the socket corresponding to the miniature grid array package mounted thereto. The socket includes metal-to-metal connection between the socket and the miniature grid array package.

The miniature grid array socket includes carrier arms arranged in rows on the carrier, slots between the carrier arms, cells arranged in an array on the carrier arms for receiving balls, contacts of the base protruding through the slots adjacent the carrier arms, carrier channels of the base for receiving the carrier arms, and the carrier being slidingly movable on the base. The socket contacts are oriented in rows alternatingly on opposite sides of the carrier arms.

A zero insertion force ball grid array socket is provided comprising a base having an array of passages therein, contacts mounted in the passages, a ball grid array package having balls protruding therefrom, a means for receiving the balls in a nonmated position with a zero insertion force, and a means for slidingly mating the balls to the contacts. The receiving means and the sliding means include a carrier having carrier arms having an array of cells for receiving the balls and slidingly mounted to the base. The socket includes carrier guides protruding from the base and defining rows of carrier channels and passages. Contacts include surface mount tails, shoulders, a beam and a head having a serpentine shape. The rows of contacts are alternatingly positioned on opposite sides of the carrier arms. The carrier includes an indentation along its outer edge allowing for insertion of a pry tool to aid in the sliding of the carrier into a mating position. The socket includes contacts having surface mount tails which are exposed in the upward perpendicular direction while the socket is carried on a circuit board. The receiving means are arranged in rows having slots therebetween and the passages are arranged in rows corresponding to the slots. The base includes an aperture having a rectangular shape corresponding to a carrier mounted therein. The aperture is of a length greater than the length of the carrier by a measure equal to the distance the balls are slid into a mated position. The socket includes two hundred and fifty-six passages. The socket includes contacts on a 0.050 inch grid.

A method of assembling a miniature grid array socket includes the steps of mounting a base to a printed circuit board, mounting a miniature grid array package to a carrier, mounting the carrier/miniature grid array package assembly to the base having contacts in a nonmated position and slidingly mating the carrier/miniature grid array package assembly to the contacts.

These and other features of the invention are set forth below in the following detailed description of the presently preferred embodiments.

DETAILED DESCRIPTION OF THE PRESENTLY PREFERRED EMBODIMENT

Figure 1:
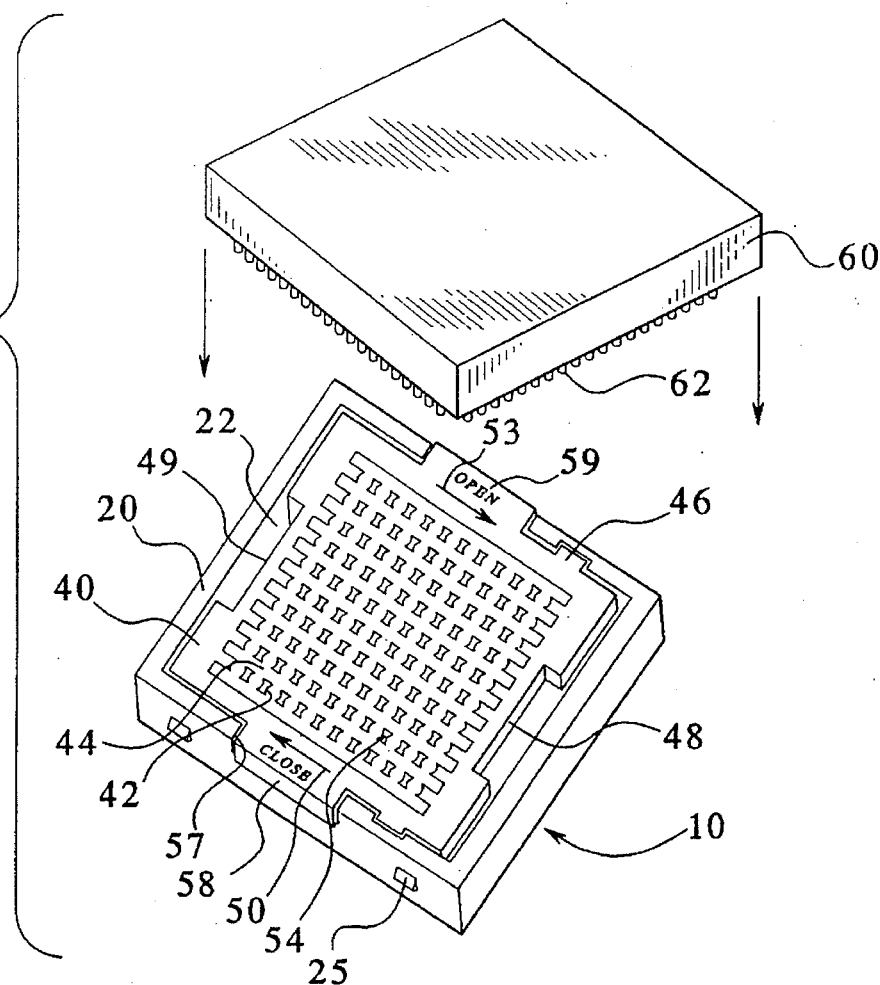
FIG. 1 is an exploded perspective view of the socket of the present invention.

An embodiment of the miniature grid array socketing system of the present invention is best understood by FIGS. 1-7. Turning to FIG. 1, socket 10 is shown having base 20 and carrier 40. The carrier 40 includes an array of cells 42, corresponding to the balls 62 of BGA package 60. In a preferred embodiment, the BGA package 60 includes two hundred and fifty-six balls on 0.050 inch×0.050 inch grids, using 0.031/0.039 inch ball diameters, such as JEDEC MO-156. In a preferred method of assembling the socket 10, the base 20, having the carrier 40 removed, is mounted to a printed circuit board. It should be noted that FIG. 1 shows the carrier 40 mounted in the base 20 prior to mounting of the BGA package 60 thereto. This arrangement is shown only for ease of description and is not indicative of the preferred method of assembly. The contacts of the base 20, as discussed below, have surface mount tails to allow for the efficient and quick surface mounting of the base 20 to a printed circuit board. The base 20 alone is exposed to solder temperatures for mounting to the printed circuit board and then cleaning operations. The base is arranged to allow for inspection of the solder joints of the soldered surface mount tails. Following inspection, the final assembly of the socket may occur. The BGA package 60 is then mounted to the carrier 40. The balls 62 of the BGA package 60 are received by cells 42 of the carrier 40. The present design allows for the balls 62 to protrude beyond the carrier arms 54 into slots 44, so that the carrier 40 may be turned over to allow for inspection of the BGA package 60 mounted thereto. The arrangement of the carrier 40 having slots 44, allows for the balls 62 to be viewed from the underside of the carrier 40, to be sure that all of the balls 62 are properly aligned in the corresponding cells 42.

Once the BGA package has been mounted to the carrier 40 and inspected, the combination BGA package 60 and carrier assembly 40 may be mounted to the base 20. The base 20 includes aperture 22 being rectangular in shape. The carrier 40 is dropped into the aperture 22 so that a key 46 is properly aligned to the base 20. The carrier 40 is mounted within the base 20 in a nonmated position and requires a zero insertion force. Subsequent to mounting within the aperture 22, the carrier 40 may be moved to the closed position in direction of arrow 52 by camming the carrier 40 into place by insertion of a camming tool in indentation 48. A tool such as a screwdriver or coin may be used to slide the carrier 40 in direction of arrow 52 so that the balls 62 of the mated BGA package 60 will become mated to the contacts of the base 20. Finger grips 58,59 project from the sides of the carrier 40 and both guide the sliding of the carrier 40 and provide a gripping surface for removal of the carrier 40 from the base 20. The finger grips 59,59 have a length shorter than the opening in which they are received so that the carrier may slide the distance of the gap provided between the finger grips 58,59 and the sides of the opening 57. The gap is limited to the sliding distance required only for a ball 62 to move from a nonmated position to a mated position, and no further. Thus, the finger grips 58,59 prohibit the balls 62 from sliding into multiple mated positions. Also protruding from the base 20 are clip mounts for heat sinks 25 or retention clips 25.

For removal of the carrier 40 from the base 20, the carrier 40 may be moved back to its nonmated position by insertion of a pry tool against indentation 49 for movement of the carrier in direction of arrow 53 so that the balls 62 slide out of their mating relationship with the contacts of the base 20. The carrier 40 may then be removed from the aperture 22 via hand removal by grasping finger grips 58,59 which extend out from under the sides of the BGA package 60, mounted thereto. In a preferred embodiment, the socket 10 is injection molded of a polymer material such as liquid crystal polymer.

Figure 2:
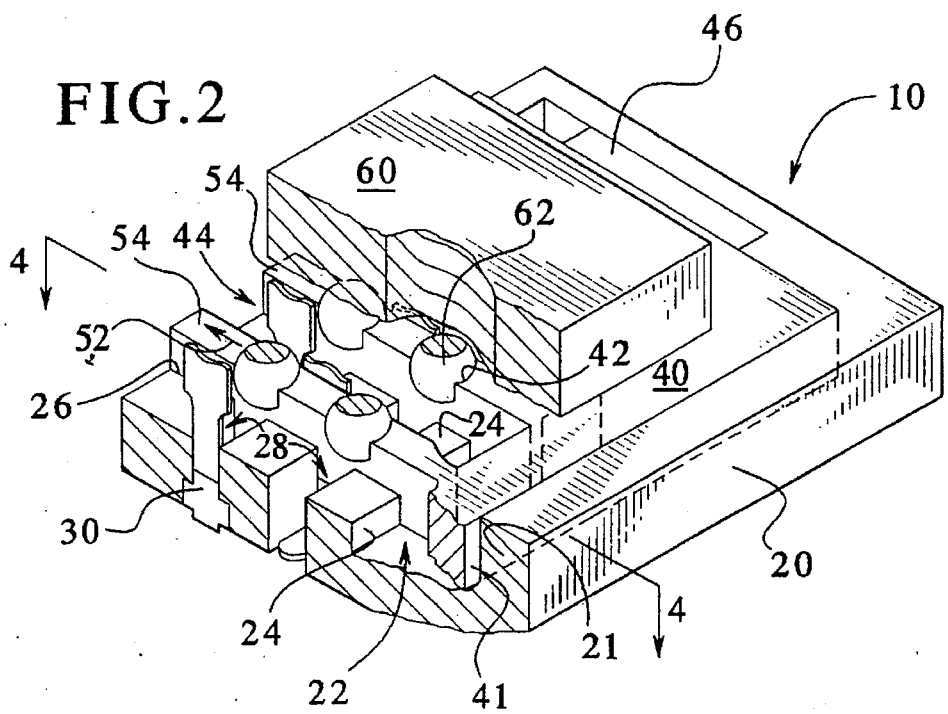
FIG. 2 is a perspective cut-away view of the socket of the present invention in a nonmated position.

Turning to FIG. 2, the socket 10 is shown in its fully assembled state. The base 20 is shown partially cut-away so that the carrier 40 mounted therein and having balls 62 mounted thereon are exposed for viewing. The carrier 40 is shown in a nonmated position so that the first edge 41 of carrier 40 abuts up against first wall 21 of the base 20. The carrier 40 is seated within aperture 22. The aperture 22 is generally rectangular in shape, corresponding to the rectangular shape of the carrier 40. However, the aperture 22 is enlarged slightly so that the carrier 40 may slide therein. However, in a preferred embodiment, the aperture 22 may only be 0.025 inches larger in one direction than the carrier 40, as this is the distance to move the BGA package 60 from its nonmated to its mated position. The aperture 20 includes rows of carrier guides 24 which define carrier channels 26 which receive carrier arms 54. The carrier guides 24 also define and surround passages 28 into which contacts 30 are mounted.

Mounted to the carrier 40 is the BGA package 60. The balls 62 of the BGA package are shown cut away from the BGA package 60 so that the socket 10 may be clearly viewed. However, it may seen that the balls 62 are attached to the underside of the BGA package 60. The balls 62 are soldered to the BGA package and via leads are attached to the I.C. The balls 62 are mounted to cells 42 of carrier arms 54. The cells 42 are shaped corresponding to the size of the balls in order to support the balls in the X-Y axis to allow transfer of movement of carrier in direction of arrow 52 to the balls 62 and BGA package 60. The width of the carrier arms 54 is less than the diameter of the balls 62. Therefore, upon mounting of the BGA package 60 to the carrier 40, the balls 62 protrude from the sides of the cells 42 on the carrier arms 54. Slots 44 are formed between the carrier arms 54 so that an opening through the entire carrier 40 is formed, enabling the inspection of the balls 62 from the bottom side of the carrier 40. Thus, after mounting of the BGA package 60 to the carrier 40, and prior to mounting the carrier to the base 20, inspection may be made of the BGA package 60 mounted to the carrier 40. By turning over the combination carrier 40 and BGA package 60 assembly, it can be seen through slots 44 that the balls 62 have been properly seated in corresponding cells 42 on the carrier arms 54. In a preferred embodiment, the BGA package 60 may also include a polarizing means to help orient the BGA package 60 to the carrier 40 so that all of the balls 62 align properly in their corresponding cells 42. After inspection, the combination carrier 40 and BGA package 60 mounted thereto are in turn mounted to the base 20.

The carrier 40 is mounted within the aperture 22 of the base 20 and aligned therein by lining up key 46 and also by inserting carrier arms 54 within carrier channels 26 of the aperture 22 of the base 20. Upon insertion of the carrier 40 within the aperture 22, the carrier 40 is located in its nonmated position, so that the balls 62 are adjacent, but not mated to contacts 30. As discussed above, the carrier 40 may be slid in the direction of arrow 52 so that the balls 62 are mated with contacts 30. Zero insertion force is required to mount the carrier 40 on the base 20 in a nonmated position. This is especially advantageous for high density grid array packages. Multiple numbers of balls 62 of the BGA package 60 exponentially increases any insertion forces. Such high insertion forces could prohibit socket designs. In the preferred embodiment, the BGA package 60 includes two hundred and fifty-six balls 62. Thus, even an insertion force of a sixteenth of a pound per ball could become excessive and prohibit the mounting of the BGA package without the aid of mechanical assistance. In the present design, such great forces have been made unnecessary due to the zero insertion force mounting of the carrier 40 in a nonmated position.

Figure 3:
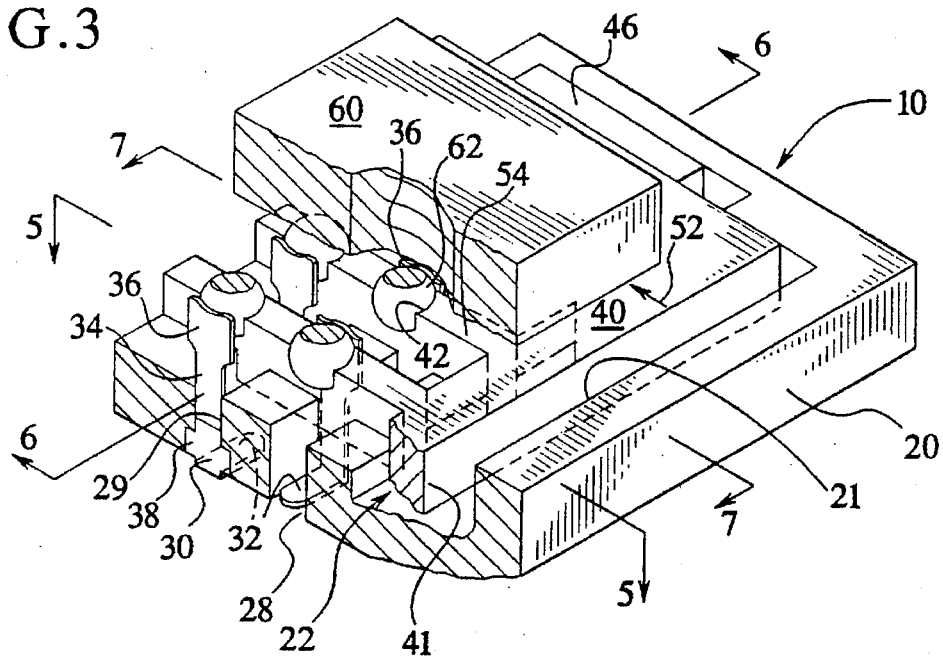
FIG. 3 is a perspective cut-away view of the socket of the present invention in a mated position.

Turning to FIG. 3, the Combination carrier 40 BGA package 60 assembly is shown in its mated position where balls 62 have been slid into position next to and in electrical contact with contacts 30. It can be seen that the carrier 40 has been slid in direction of arrow 52 and the first edge 41 is no longer in abutting contact with the first wall 21 of aperture 22 of the base 20. As the combination carrier 40 and BGA package 60 mounted thereto are slid in direction of arrow 52, the balls 62 mounted in cells 42 of carrier arms 54 of the carrier 40 are slidingly mated with the contacts 30.

The contacts 30 include a surface mount tail 32, an angled working beam 34, a head 36 and shoulders 38. Assembly of the contacts 30 to the base 20 occurs by insertion of the contact 30 through the bottom of the base 20. The contact head 36 and beam 34 are slid up and through retention slots 29 until shoulders 38 abut the bottom of the retention slot 29 providing for the press-fit of the contact 30 therein. The head 36 of the contact 30 includes a serpentine shape to ensure the positive mating of the balls 62. It can also be appreciated that due to the contact design the base 20 includes the standard BGA footprint. As the contact tails 32 are directly below the balls 62 to which they are mated, the same footprint is retained. Therefore, no increased real estate is required and the size of the BGA package 60 approximates the actual size of the socket 10. It may be seen that the contacts 30 are alternatingly positioned on either side of the carrier arms 54. This alternating orientation of the contacts 30 provide for an even force against the BGA package and combined pressure in a single direction against the BGA package 60 occurs.

It can be seen that surface mount tails 32 of contacts 30 are exposed below the base 20. This arrangement allows for the quick and efficient surface mounting of the base 20 to a printed circuit board. As the tails 32 are positioned in passages 28, the tails may be viewed from perpendicularly above the base 20, prior to mounting of the carrier 40 and BGA package 60 thereto. In a preferred embodiment, prior to mating of the BGA package 60. The base 20 is positioned on a printed circuit board via polarizing pegs. The printed circuit board and base 20 may then be exposed to heat and wave soldered. After soldering, the contact tails 32 and their solder joints may be inspected from above the passages 28. Should a proper electrical contact of the surface mount tail 32 have not been achieved, the passage 28 allows for the insertion of an instrument to reflow the solder for that contact tail 32. The design of the present invention provides for a single reflow step of the base 20 to a printed circuit board. A second reflow step after mounting of the BGA package 60 is not required. Exposure to heat occurs only to the base and not the BGA package 60. As the balls 62 are attached to the BGA package via solder, such a reflow process could be harmful to the attachment of the balls 62. Therefore, any degradation of the balls 62 of the BGA package 60 is avoided. Following mounting of the base 20 to the printed circuit board, the BGA package 60 mounted to the carrier 40 may then be mounted in the aperture 22 of the base 20.

Figure 4:
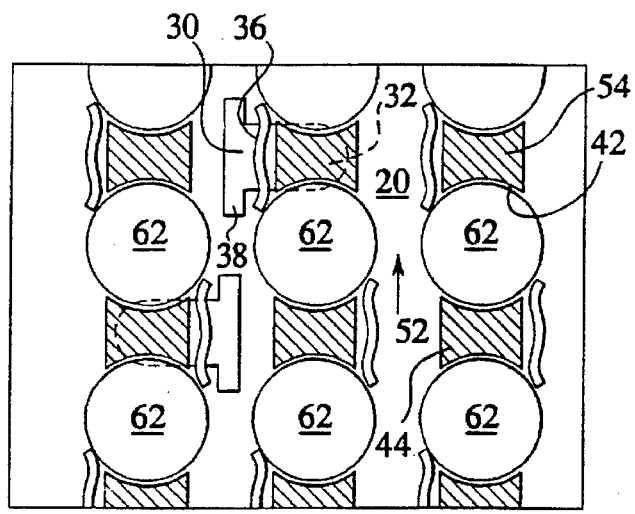
FIG. 4 is a plan view of FIG. 2, taken at line 4—4.

Turning to FIG. 4, a sectional plan view of FIG. 2 taken at line 4—4 is shown. Carrier arms 54 of the earlier are mounted to the base 20 in a nonmated position. Balls 62 are mounted within cells 42 of the carrier arms 54. The balls 62 are mounted adjacent to contacts 30. The contacts 30 include contact head 36, surface mount tail 32 and shoulders 38. It can be seen that the diameter of the balls 62 is greater than the width of the carrier arms 54 and the edges of the balls 62 protrude form the cells 42. As the slots 44 adjacent the carrier arms 54 continue all the way through the carrier, the protruding sides of the balls 62 are visible and inspectable from the bottom of the carrier. Therefore, after the BGA package is mounted to the carrier, the positioning of the balls 62 within cells 42 are inspectable. After mounting of the carrier to the base 20, the carrier is moved in direction of arrow 52 to mate the balls 62 to the contacts 30 and with the contact heads 36.

Figure 5:
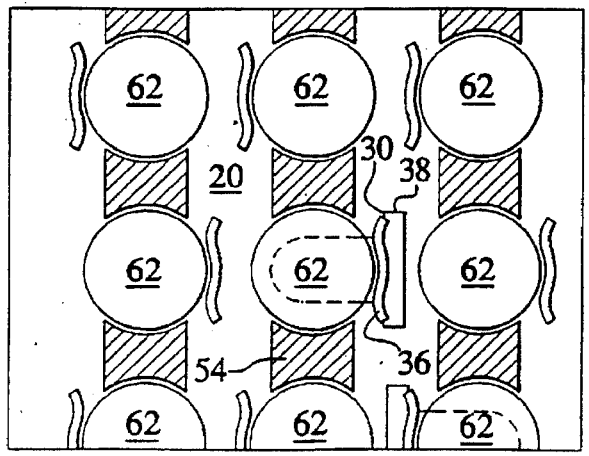
FIG. 5 is a plan view of FIG. 3 taken at line 5—5.

Turning to FIG. 5, a sectional plan view of FIG. 3 taken at line 5—5 is shown. The balls 62 are shown in a mated position with contacts 30. The contact head 36 is in abutting relationship to the balls 62. In comparing the position of the contact head 36 from its mated position in FIG. 5 to its nonmated position in FIG. 4, it can be seen that the head 36 has moved transverse to the direction of the carrier arms 54 so that it is positioned above the shoulders 38 of the contact 30. The sliding engagement of the balls 62 causes the head 36 to resiliently move away from the carrier arms 54. The serpentine shape of the contact head 36 allows for the balls 62 to slide therepast. The contact head 36 has a dip at its center portion which provides for the centering of the balls 62 on the contact head 36. Therefore, upon sliding of the carrier into position, them will be a positive alignment point of all of the balls 62 centered upon heads 36 of the contacts 30.

Figure 6:
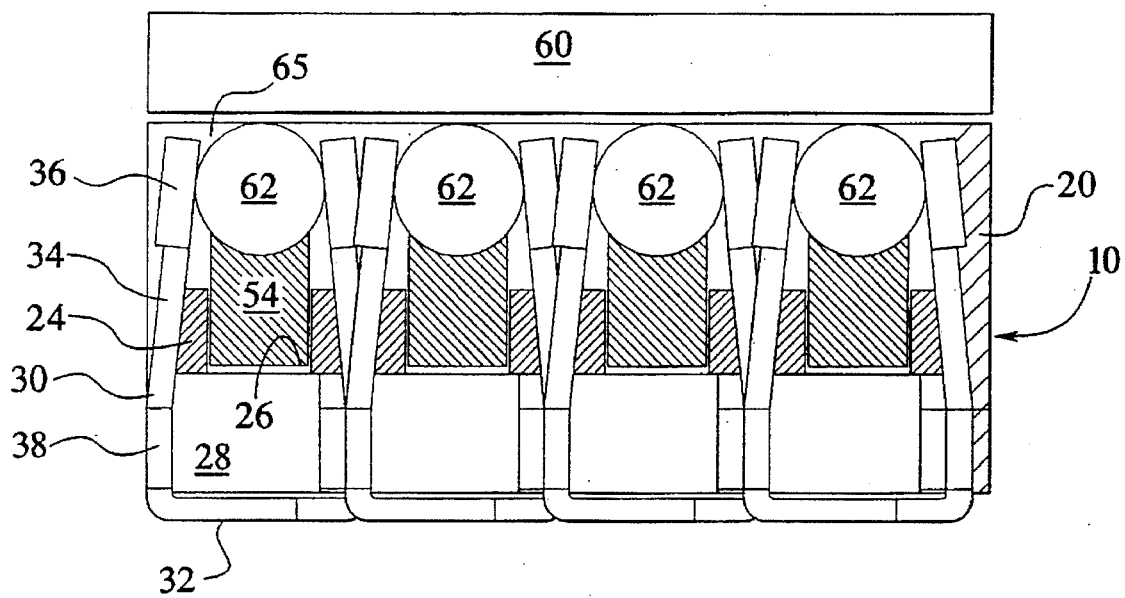
FIG. 6 is a side elevation cut-away view of FIG. 3, taken at line 6—6.

Turning to FIG. 6, a slide elevation cut-away view of FIG. 3 is shown taken at line 6—6. Contacts 30 are shown in a mated position with balls 62. The contacts include beam 34, head 36, shoulders 38 and surface mount tails 32. It can be seen that the beam 34 is angled toward the carrier arms 54. The contact head 36 is offset towards the top half of the balls 62. The contact head 36 being above the equator of the balls 62 provides for a downward force and a more positive electrical connection between the contact 30 and the BGA package 60. The beam 34 as shown in FIG. 6 in its mated condition provides a normal force of the contact head 36 against the balls 62. When the balls 62 are in a nonmated position, the beam 34 has an increased angle towards the carrier arms 54. The carrier arms 54 are mounted in carrier channels 26 which are formed by the carrier guides 24.

The balls 62 are shown attached to the BGA package 60 via solder 65. The preferred embodiment of this invention includes BGA packages 60 which have nondeformable balls 62. These balls 62 are generally formed of hard metallic materials and will not deform under input of heat. However, the present invention may also accept deformable balls generally made of tin-lead materials.

It can be seen that below the balls 62 is passage 28 which is open to the surface mount tail 32 below. It can be seen that the surface mount tail 32 is inspectable through passage 28 when the BGA package 60 is removed. It is also apparent that the surface mount tails 32 project below the bottom of base 20 to provide for the surface mounting of the surface mount tails 32 to a printed circuit board.

Figure 7:
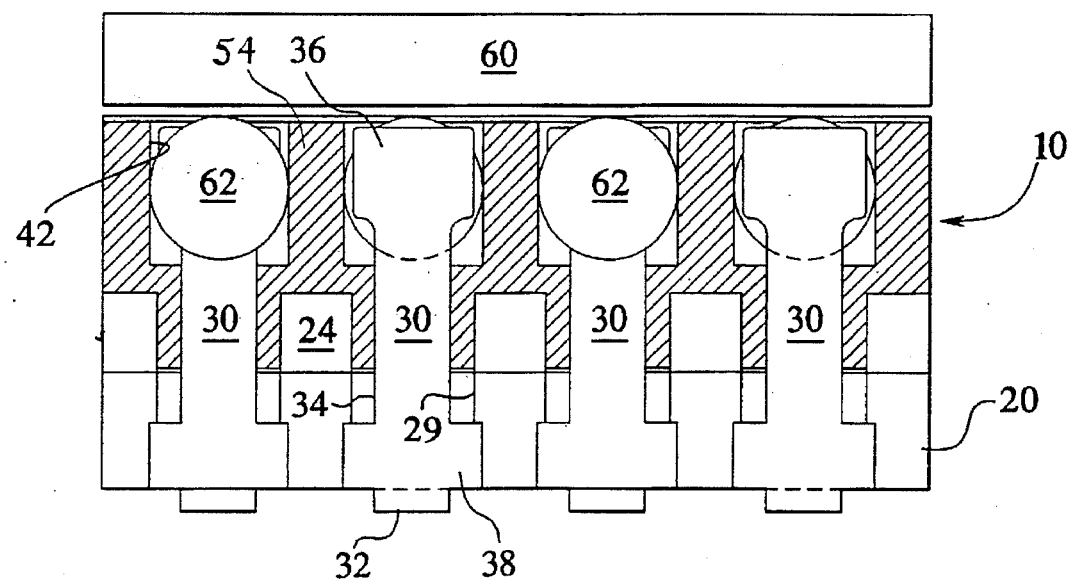
FIG. 7 is a side elevation cut-away view of FIG. 3, taken at line 7—7.

Turning to FIG. 7, a side elevation cut-away view of FIG. 3, taken at line 7—7 is shown. The balls 62 are shown in mated orientation with contacts 30. The balls 62 are shown mounted within cells 42 of the carrier arms 54. It can be seen that the contact 39 is mounted in retention slot 29 which is broad enough to allow head 36 and beam 34 to slide therethrough. However, shoulders 38 abut against the bottom of the retention slot 29 and provide a press-fit of the contact 30 therein. The surface mount tails 32 protrude below the bottom of the base 20 and provide for surface mounting of the socket 10 to a printed circuit board.

In a preferred embodiment, the contacts have an overall height of 0.090 inch and a beam having a width of 0.020 inch and a head having a width of 0.030 inch. The deflection of the beam is 0.006 inch and provides for at least one hundred grams of normal force against the balls. In a preferred embodiment, the contacts may be formed on a two-up progressive die having the contacts alternatingly mounted so that the contact tails alternate in their direction on the die so that a row of contacts may be gang loaded within the base 20 of the socket 10. The contacts in a preferred embodiment are stamped on the progressive die on 0.050 inch spacing. It may be appreciated from the present invention that the overall additional height added to the BGA package is approximately 0.060 inch. The overall height of the socket is approximately 0.090 inch. As the balls are inserted within the socket to approximately 0.030 inch, there is only an additional 0.060 inch added to the profile of the BGA package, as compared to mounting directly to the board. In a preferred embodiment, the contacts are a metallic material such as beryllium copper.

It should be understood that various changes and modifications to the presently preferred embodiments described herein will be apparent to those skilled in the art. For example, various size grids may be accommodated by the present design. Such changes and modifications may be made without departing from the spirit and scope of the present invention and without diminishing its attendant advantages. It is, therefore, intended that such changes and modifications be covered by the appended claims.

What is claimed is:

1. A zero insertion force ball grid array socket system comprising:

a base having an array of passages therein;

contacts mounted in said passages;

a ball grid array package having balls protruding therefrom;

a carrier mounted to the base;

carrier arms arranged in rows on said carrier;

slots between said carrier arms;

cells arranged in an array on said carrier arms for receiving balls of the ball grid array package;

contacts of said base protruding through said slots adjacent opposite sides of each of said carrier arms;

carrier channels of said base for receiving said carrier arms; and the contacts including a head and a beam having a length and angle sufficient to provide for mating said head to said balls at a position above an equator of said balls.

2. The socket of claim 1 including carrier guides protruding from said base and defining rows of carrier channels and said passages.

3. The socket of claim 1 wherein rows of said contacts are alternatingly positioned on opposite sides of the carrier arms.

4. The socket of claim 1 wherein said carrier includes keys for positioning the carrier within said base and heat sink clip mounts.

5. The socket of claim 1 wherein said carrier includes an indentation along its outer edge allowing for insertion of a pry tool to aid in the sliding of said carrier into a mating position.

6. The socket of claim 1 wherein said contacts include surface mount tails which are exposed in an upward perpendicular direction while the socket is carried on a circuit board.

7. The socket of claim 1 wherein said base includes an aperture having a rectangular shape corresponding to a carrier mounted therein, said aperture having a length greater than a length of said carrier by a measure equal to the distance said balls are slid into a mated position.

8. The socket of claim 1 including two hundred and fifty-six passages.

9. The socket of claim 1 including said contacts on a 0.050 inch grid.

10. A miniature grid array socket system comprising:

a base having contacts mounted therein, the contacts having a curved head portion;

an IC package having balls protruding therefrom;

a carrier mounted to the base and having carrier arms, the carrier arms having cells for receiving the balls of the IC package, the cells include a cell wall having an overall substantial congruency to a perimeter of a ball at a support area defined by the perimeter of the ball; and wherein the carrier arms are moved against the balls in order to move the balls of the IC package to make electrical contact with the contacts of the socket so that the socket can be formed with a low profile.

11. The socket of claim 10 wherein the carrier includes slots which allow for the inspection of the IC package mounted thereto.

12. The socket of claim 10 wherein said array of contacts provide a footprint of said socket corresponding to the IC package mounted thereto.

13. The socket of claim 10 wherein metal-to-metal connection is made between said socket and the IC package mounted thereto.

14. The socket of claim 10 wherein said contacts are oriented in rows alternatingly on opposite sides of said carrier arms.

15. The miniature grid array pocket system of claim 10 wherein the cell wall abuts against the balls.

16. The miniature grid array socket system of claim 10 wherein a portion of the cell wall and the perimeter of the terminal are substantially circular and have approximately equal radii.

17. The miniature grid array socket system of claim 10 wherein the cell wall provides a strain relief for the terminal in its mated position.

18. The miniature grid array socket system of claim 10 wherein normal forces in excess of 100 grams may be acted against the terminals without being dislodged or degraded.

\* \* \* \* \*